(12) United States Patent
Kim

(10) Patent No.: US 9,633,790 B1
(45) Date of Patent: Apr. 25, 2017

(54) MULTILAYER CERAMIC CAPACITOR AND BOARD HAVING THE SAME

(71) Applicant: SAMSUNG ELECTRO-MECHANICS CO., LTD., Suwon-si, Gyeonggi-do (KR)

(72) Inventor: Hyun Tae Kim, Suwon-si (KR)

(73) Assignee: SAMSUNG ELECTRO-MECHANICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 15/247,453

(22) Filed: Aug. 25, 2016

(30) Foreign Application Priority Data

Mar. 23, 2016 (KR) .................. 10-2016-0034895

(51) Int. Cl.
*H01G 4/12* (2006.01)
*H01G 4/30* (2006.01)
*H05K 1/18* (2006.01)
*H05K 1/11* (2006.01)
*H01G 4/005* (2006.01)
*H01G 4/228* (2006.01)

(52) U.S. Cl.
CPC .............. *H01G 4/12* (2013.01); *H01G 4/005* (2013.01); *H01G 4/228* (2013.01); *H01G 4/30* (2013.01); *H05K 1/111* (2013.01); *H05K 1/181* (2013.01); *H05K 2201/10015* (2013.01)

(58) Field of Classification Search
CPC ...... H01G 4/12; H01G 4/1209; H01G 4/1218; H01G 4/1227; H01G 4/1236; H01G 4/1245; H01G 4/1263; H01G 4/1272; H01G 4/1281; H01G 4/129
See application file for complete search history.

(56) References Cited

U.S. PATENT DOCUMENTS

2014/0376153 A1   12/2014   Kim
2015/0021082 A1   1/2015    Park et al.

FOREIGN PATENT DOCUMENTS

KR   10-2013-0025595 A   3/2013
KR   10-2015-0009922 A   1/2015

*Primary Examiner* — Jeremy C Norris
(74) *Attorney, Agent, or Firm* — McDermott Will & Emery LLP

(57) ABSTRACT

A multilayer ceramic capacitor has a 3-terminal, vertical, multilayer structure in which portions of lead portions are not covered by external electrodes but are exposed to a mounting surface of a ceramic body. Insulating portions are disposed between the external electrodes on the mounting surface of the ceramic body. The insulating portions have an overlap portion covering portions of the external electrodes. $0.005 \leq i/e \leq 0.7$ is satisfied, where i is a width of the overlap portion, and e is a width of the external electrode partially covered by the overlap portion.

11 Claims, 9 Drawing Sheets

MULTILAYER CERAMIC CAPACITOR AND BOARD HAVING THE SAME

CROSS-REFERENCE TO RELATED APPLICATION(S)

This application claims benefit of priority to Korean Patent Application No. 10-2016-0034895 filed on Mar. 23, 2016 in the Korean Intellectual Property Office, the disclosure of which is incorporated herein by reference in its entirety.

TECHNICAL FIELD

The present disclosure relates to a multilayer ceramic capacitor and a board having the same.

BACKGROUND

In accordance with the recent trend for miniaturization and increased capacitance of electronic products, demand for electronic components used in electronic products having a small size and high capacitance has increased.

Among such electronic products, in the case of a multilayer ceramic capacitor, when equivalent series inductance (hereinafter, referred to as "ESL") increases, performance of an electronic product may deteriorate. In addition, as the electronic components have been miniaturized and had high capacitance implemented therein, the influence of an increase in ESL of the multilayer ceramic capacitor on the deterioration of performance of the electronic component has relatively increased.

Particularly, in order to achieve higher degrees of performance in an integrated circuit (IC), the use of a decoupling capacitor has increased. Therefore, demand for a multilayer ceramic capacitor (MLCC) having a 3-terminal, vertical, multilayer structure, a so-called "low-inductance chip capacitor (LICC)," capable of decreasing inductance of the capacitor by decreasing the distance between external terminals to decrease a current flow path, has increased.

SUMMARY

An aspect of the present disclosure may provide a multilayer ceramic capacitor able to further increase capacitance and significantly increasing low equivalent series inductance (ESL) characteristics, while also being capable of securing contact properties at a predetermined level or higher, while protecting exposed portions of internal electrodes, and a board having the same.

According to an aspect of the present disclosure, there are provided a multilayer ceramic capacitor and a board having the same. The multilayer ceramic capacitor may have a 3-terminal, vertical, multilayer structure in which portions of lead portions are not covered by external electrodes but are exposed to a mounting surface of a ceramic body, and insulating portions are disposed between the external electrodes on the mounting surface of the ceramic body. The insulating portions have an overlap portion covering portions of the external electrodes. $0.005 \leq i/e \leq 0.7$ is satisfied, in which i is a width of the overlap portion and e is a width of the external electrode partially covered by the overlap portion of the insulating portions.

BRIEF DESCRIPTION OF DRAWINGS

The above and other aspects, features, and advantages of the present disclosure will be more clearly understood from the following detailed description when taken in conjunction with the accompanying drawings, in which.

DETAILED DESCRIPTION

Hereinafter, exemplary embodiments in the present disclosure will now be described in detail with reference to the accompanying drawings.

Terms with respect to directions of a hexahedron will be defined in order to clearly describe exemplary embodiments in the present disclosure. L, W and T illustrated in FIG. 1 denote to a length direction, a width direction, and a thickness direction, respectively. Here, the width direction may be the same as a stacking direction in which dielectric layers are stacked.

Multilayer Ceramic Capacitor

Figure 1:
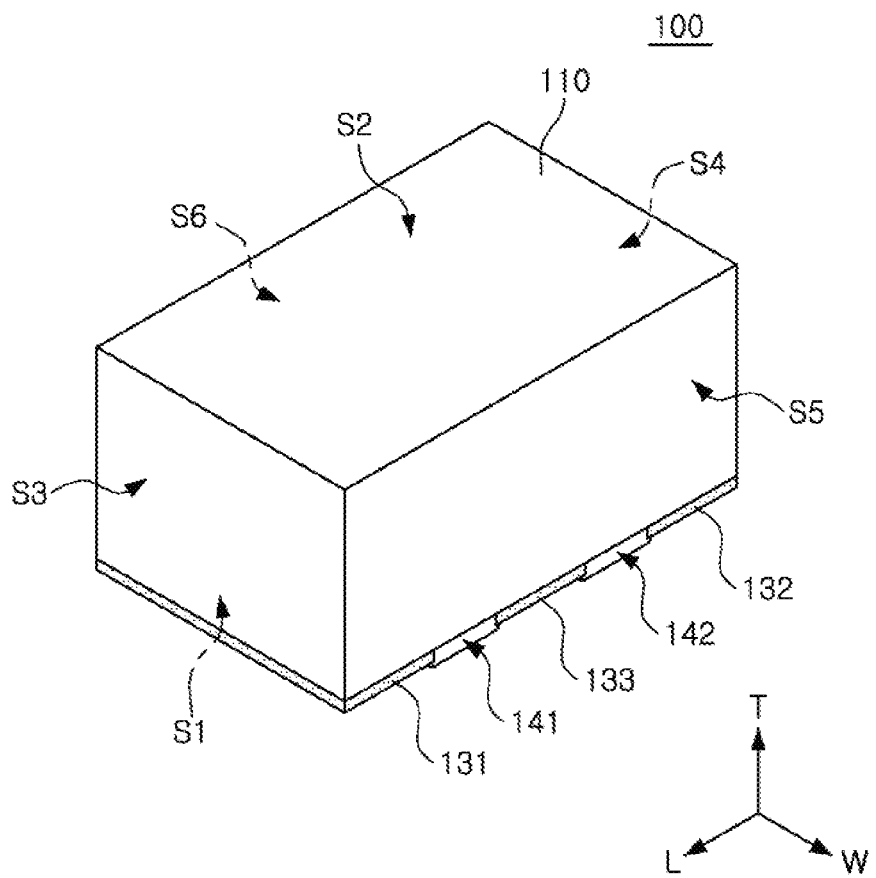
FIG. 1 is a perspective view schematically illustrating a multilayer ceramic capacitor according to an exemplary embodiment in the present disclosure.
Figure 2:
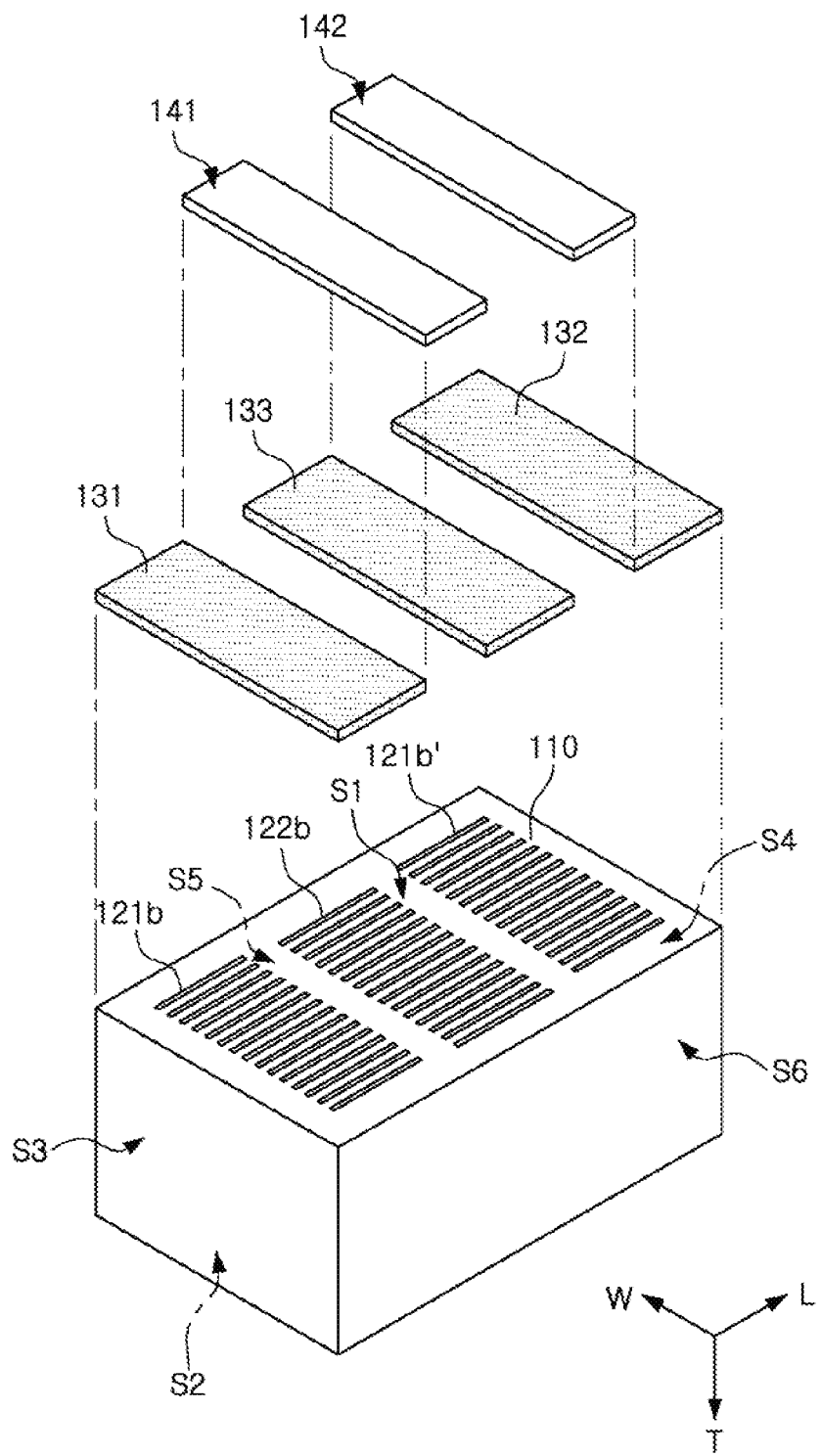
FIG. 2 is an exploded perspective view illustrating a ceramic body of the multilayer ceramic capacitor of FIG. 1 in an inverted state.
Figure 3:
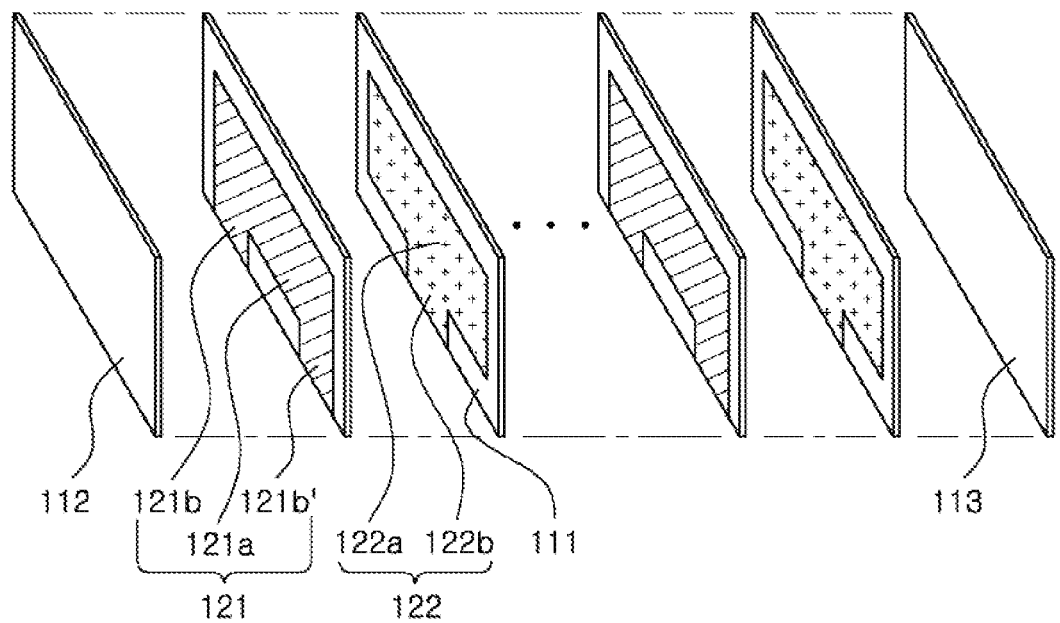
FIG. 3 is an exploded perspective view schematically illustrating a stacking structure of internal electrodes of the multilayer ceramic capacitor of FIG. 1.
Figure 4A:
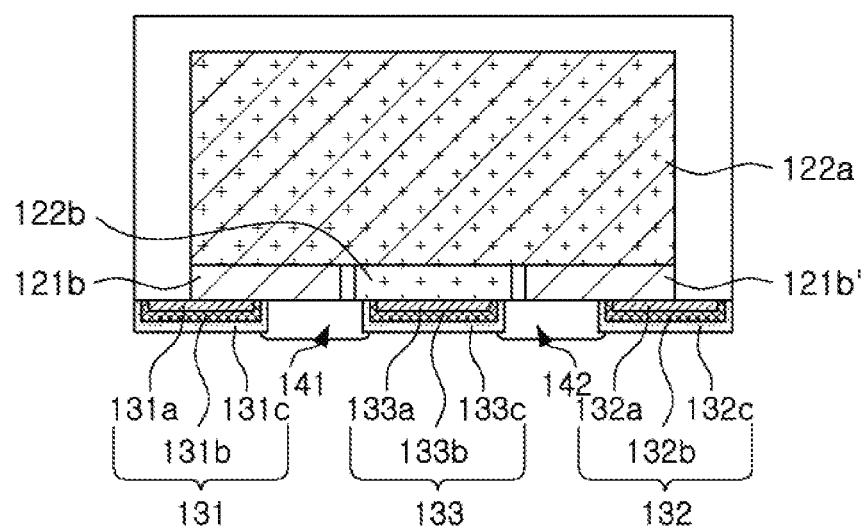
FIG. 4A is a cross-sectional view of the multilayer ceramic capacitor of FIG. 1, cut along a length-thickness plane.
Figure 4B:
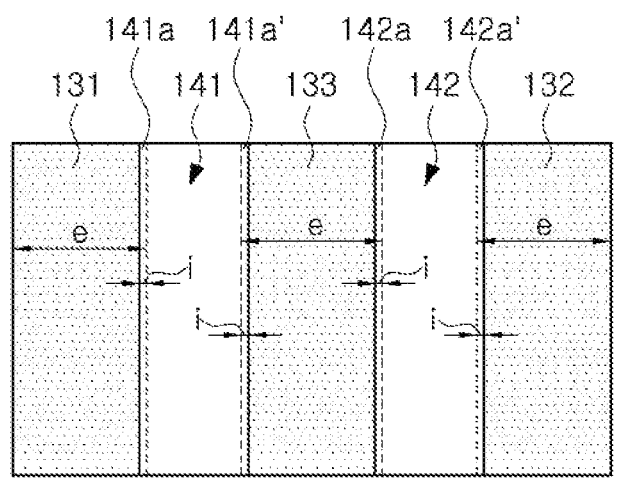
FIG. 4B is a bottom view illustrating an example of an insulating part of the multilayer ceramic capacitor, according to the exemplary embodiment in the present disclosure.

FIG. 1 is a perspective view schematically illustrating a multilayer ceramic capacitor according to an exemplary embodiment in the present disclosure, FIG. 2 is an exploded perspective view illustrating a ceramic body of the multilayer ceramic capacitor of FIG. 1 in an inverted state, FIG. 3 is an exploded perspective view schematically illustrating a stacking structure of internal electrodes of the multilayer ceramic capacitor of FIG. 1, while FIG. 4A is a cross-sectional view of the multilayer ceramic capacitor of FIG. 1, cut along a length-thickness plane, FIG. 4B is a bottom view illustrating an example of an insulating part of the multilayer ceramic capacitor, according to the exemplary embodiment in the present disclosure.

Referring to FIGS. 1 through 4B, the multilayer ceramic capacitor 100 according to the exemplary embodiment in the present disclosure may include a ceramic body 110 in which a plurality of dielectric layers 111 are stacked in the width direction, an active layer including a plurality of first and second internal electrodes 121 and 122, first to third external electrodes 131 to 133, and first and second insulating portions 141 and 142.

The multilayer ceramic capacitor 100, according to the present exemplary embodiment, may be a 3-terminal, vertical, multilayer capacitor which has three external electrodes and in which internal electrodes stacked in the capacitor are disposed perpendicularly to a mounting surface of a board.

The ceramic body 110 may have first and second surfaces S1 and S2 opposing each other in the thickness direction, third and fourth surfaces S3 and S4 connecting the first and second surfaces S1 and S2 to each other and opposing each other in the length direction, and fifth and sixth surfaces S5 and S6 opposing each other in the width direction.

Hereinafter, in the present exemplary embodiment, the case in which a mounting surface of the multilayer ceramic capacitor 100 is the first surface S1 of the ceramic body 110 is provided; however, the present disclosure is not limited thereto.

The ceramic body 110 as described above may be formed by stacking the plurality of dielectric layers 111 in the width direction and then sintering the stacked dielectric layers 111, and a shape thereof is not particularly limited, but may be a hexahedral shape, as illustrated in the accompanying drawings.

The plurality of dielectric layers 111 configuring the ceramic body 110 may be in a sintered state, and adjacent dielectric layers 111 may be integrated with each other so that boundaries therebetween are not readily apparent without the use of a scanning electron microscope (SEM).

Further, the dielectric layer 111 may contain a ceramic powder having high permittivity, for example, a barium titanate ($BaTiO_3$)-based powder, a strontium titanate ($SrTiO_3$)-based powder, or the like, but the material of the dielectric layer 111 is not limited thereto as long as sufficient capacitance may be obtained therewith.

In addition, if necessary, the dielectric layer 111 may further contain a ceramic additive, an organic solvent, a plasticizer, a binder, a dispersant, and the like, in addition to the ceramic powder.

The ceramic body 110 as described above may include an active layer having a plurality of internal electrodes as apart contributing to forming capacitance of the capacitor, and cover layers 112 and 113 disposed on both sides of the active layer as margin portions in the width direction, respectively.

The active layer may be formed by repeatedly stacking the plurality of first and second internal electrodes 121 and 122 with respective dielectric layers 111 interposed therebetween in the width direction.

The cover layers 112 and 113 may have the same material and configuration as those of the dielectric layer 111, except that internal electrodes are not included therein.

The cover layers 112 and 113 as described above may be formed by stacking a single dielectric layer or two or more dielectric layers on both sides of the active layer in the width direction, respectively, and basically serve to prevent the first and second internal electrodes 121 and 122 from being damaged by physical or chemical stress.

The first and second internal electrodes 121 and 122, electrodes to which electrical currents having different polarities are applied, may be formed in the ceramic body 110 and disposed to face each other with respective dielectric layers 111 interposed therebetween.

In this case, the first and second internal electrodes 121 and 122 may be electrically insulated from each other by the dielectric layer 111 disposed therebetween.

Further, the first and second internal electrodes 121 and 122 may be disposed to be spaced apart from the third and fourth surfaces S3 and S4 of the body 110 by a predetermined distance in order to increase reliability by preventing infiltration of external foreign materials.

In addition, a material forming the first and second internal electrodes 121 and 122 is not particularly limited. For example, the first and second internal electrodes 121 and 122 may be formed using a conductive paste formed of at least one noble metal, such as palladium (Pd), nickel (Ni), copper (Cu), a palladium-silver (Pd—Ag) alloy, or the like.

As a printing method of the conductive paste, a screen printing method, a gravure printing method, or the like, may be used, but the printing method is not limited thereto.

The first and second internal electrodes 121 and 122 as described above may include first and second body portions 121a and 122a, which overlap adjacent internal electrodes to contribute to forming capacitance, and first and second lead portions 121b and 121b' and a third lead portion 122b as regions formed by partially increasing a width of the first and second body portions 121a and 122a to thereby extend toward the mounting surface of the ceramic body 110, respectively.

End portions of the first and second lead portions 121b and 121b' and the third lead portion 122b may be exposed to the outside through the mounting surface of the ceramic body 110.

Further, although not particularly limited, the first to third lead portions 121b, 121b', and 122b may have a length shorter than that of the first and second body portions 121a and 122a in the thickness direction, in order to increase capacitance.

According to the present exemplary embodiment, the first and second lead portions 121b and 121b' may be disposed to be spaced apart from each other in the length direction of the ceramic body 110 and formed to have a length extending from the first body portion 121a of the first internal electrode 121, respectively, so as to be exposed to the first surface S1 of the ceramic body 110, the mounting surface.

In addition, the third lead portion 122b may be disposed between the first and second lead portions 121b and 121b' and formed to have a length extending from the second body portion 122a of the second internal electrode 122 so as to be exposed to the first surface S1 of the ceramic body 110.

In a 3-terminal, vertical, multilayer capacitor, in order to significantly decrease a current path, it is advantageous to significantly decrease a margin portion between lead portions. However, since in the case of decreasing an interval between the lead portions, an interval between external electrodes may also be decreased, a short-circuit may occur between the electrodes, such that there is a limitation in significantly decreasing the margin portion between the lead portions.

Therefore, in a case of adjusting a length or width of the margin portion of the dielectric layer to increase an area of an overlap region of the first and second body portions 121a and 122a and decreasing an interval between the first or second lead portion 121b or 121b' and the third lead portion 122b, capacitance of the capacitor may also be increased in proportion to an increase in an area of the entire overlap region of the first and second internal electrodes 121 and 122, and a current loop may be further decreased due to a decrease in current path at the time of applying an alternating current (AC) voltage to the external electrodes, such that inductance of the capacitor may be decreased.

In addition, since insulating portions to be described below are disposed between the external electrodes on the first surface S1 of the ceramic body 110, the internal electrodes exposed to the outside may be covered, and a short-circuit between the electrodes may be prevented.

The first and second external electrodes 131 and 132, electrodes to which electrical currents having the same polarities are applied, may be disposed on the first surface S1 of the ceramic body 110, a mounting surface, to be spaced apart from each other in the length direction of the ceramic body 110, and may contact the first and second lead portions 121b and 121b' exposed to the first surface S1 of the ceramic body 110 to thereby be electrically connected thereto, respectively.

Further, if necessary, the first and second external electrodes 131 and 132 may extend from the first surface S1 of the ceramic body 110 to portions of the fifth and sixth surfaces S5 and S6 of the ceramic body 110 in the width direction, so as to increase adhesion strength.

In addition, if necessary, the first and second external electrodes 131 and 132 may extend from the first surface S1 of the ceramic body 110 to portions of the third and fourth surfaces S3 and S4 of the ceramic body 110 in the length direction, respectively, so as to increase adhesion strength and electrical connectivity at the time of mounting the capacitor on a board.

The third external electrode 133, an electrode to which an electrical current having a different polarity to the first and second external electrodes 131 and 132 different is applied, may be utilized, for example, as a ground terminal in the present exemplary embodiment.

The third external electrode 133 may be disposed between the first and second external electrodes 131 and 132 and contact the third lead portion 122b exposed to the first surface S1 of the ceramic body 110, to thereby be electrically connected thereto.

Further, if necessary, the third external electrode 133 may extend from the first surface S1 of the ceramic body 110 to portions of the fifth and sixth surfaces S5 and S6 of the ceramic body 110 in the width direction, so as to increase adhesion strength.

Since, in a two-terminal multilayer ceramic capacitor, external electrodes are disposed on both surfaces of a ceramic body opposing each other in a length direction, and a current path at the time of applying an AC voltage to the external electrodes is relatively long, a current loop is formed to be larger, and a magnitude of an induced magnetic field is increased, such that inductance may be increased.

In the present exemplary embodiment, the first to third external electrodes 131 to 133 may be disposed on the first surface S1 of the ceramic body 110, the mounting surface of the ceramic body 110 in the thickness direction, such that the current loop may be decreased due to a decrease in current path at the time of applying the AC voltage to the external electrodes, thereby decreasing the magnitude of the induced magnetic field to decrease inductance (ESL) of the capacitor, while increasing capacitance.

Meanwhile, if necessary, the first to third external electrodes 131 to 133, according to the present exemplary embodiment, may have a three-layer structure.

For example, the first to third external electrodes 131 to 133 may include first to third conductive layers 131a to 133a contacting the corresponding lead portions of the internal electrodes to thereby be connected thereto, respectively, first to third nickel (Ni) plating layers 131b to 133b, formed to cover the first to third conductive layers 131a to 133a, and first to third tin (Sn) plating layers 131c to 133c, formed to cover the first to third nickel plating layers 131b to 133b, respectively.

In this case, the first to third conductive layers 131a to 133a may be formed of the same conductive material as that of the first and second internal electrodes 121 and 122.

However, the material of the first to third conductive layers 131a to 133a is not limited thereto, and may be a metal powder formed of a metal such as copper (Cu), silver (Ag), nickel (Ni), or the like, and may be formed by applying a conductive paste prepared by adding glass frit to the metal powder and sintering the applied conductive paste.

According to the present exemplary embodiment, portions of the first and second lead portions 121b and 121b' exposed to the outside of the ceramic body 110 may not be covered by the first and second external electrodes 131 and 132 but may be exposed to the first surface S1 of the ceramic body 110.

In addition, opposite portions of the third lead portion 122b exposed to the outside of the ceramic body 110 may not be covered by the third external electrode 133 but may be exposed to the first surface S1 of the ceramic body 110.

That is, the current loop may be further decreased by increasing sizes of the first to third lead portions of the first and second internal electrodes by as much as possible, in order to decrease the current path at the time of applying the AC voltage to the external electrodes, such that inductance (ESL) of the capacitor may be further decreased by further decreasing the magnitude of the induced magnetic field.

In addition, the first and second insulating portions 141 and 142 may be disposed on the first surface S1 of the ceramic body 110 to cover the portions of the first to third lead portions 121b, 121b', and 122b which are not covered by the first to third external electrodes 131 to 133 but are exposed to the first surface S1 of the ceramic body 110.

The first and second insulating portions 141 and 142 may be formed of an insulating material such as an epoxy, ceramic slurry, or the like.

In this case, the first insulating part 141 may be disposed between the first and third external electrodes 131 and 133 on the first surface S1 of the ceramic body 110, and both end portions thereof may become a pair of first overlap portions 141a and 141a' respectively covering portions of the first and third external electrodes 131 and 133.

The second insulating part 142 may be disposed between the second and third external electrodes 132 and 133 on the first surface S1 of the ceramic body 110, and both end portions thereof may become a pair of second overlap portions 142a and 142a' respectively covering portions of the third and second external electrodes 133 and 132.

The first and second insulating portions 141 and 142 may serve to cover all of the exposed portions of the first to third lead portions 121b, 121b', and 122b to prevent problems such as a short-circuit between the lead portions by partial exposure of the first to third lead portions 121b, 121b', and 122b to the outside of the ceramic body 110 and deterioration of moisture resistance, or to the problem of a short-circuit caused by external foreign materials.

Further, if necessary, the first and second insulating portions 141 and 142 may extend from the first surface S1 of the ceramic body 110 to portions of the fifth and sixth surfaces S5 and S6 of the ceramic body 110 in the width direction so as to increase adhesion strength.

Here, in view of securing reliability, the larger the size of the first and second insulating portions 141 and 142, and the wider the width of the first and second overlap portions, the more advantageous. However, in a case in which the width of the first and second overlap portions is excessively wide, an area of the external electrodes may be relatively decreased, such that contact properties may be rapidly deteriorated at the time of testing reliability of the external electrodes.

According to the exemplary embodiment in the present disclosure, when a width of one of the first and second overlap portions is defined as i, and a width of one of the first to third external electrodes corresponding to i is defined as e, i/e may satisfy 0.005≤i/e≤0.7.

In the above-mentioned numerical range, reliability of a product may be secured at a predetermined level or higher, while contact properties may also be secured at a predetermined level or higher at the time of testing reliability of the external electrodes.

EXPERIMENTAL EXAMPLE

Multilayer ceramic capacitors based on Inventive Examples and Comparative Examples in the present disclosure were manufactured as follows.

Slurry containing a powder such as a barium titanate ($BaTiO_3$) powder or the like was applied to and dried on a carrier film, thereby preparing a plurality of ceramic green sheets having a thickness of 1.8 μm.

Next, a first internal electrode having first and second lead portions exposed to a first surface of the ceramic green sheet and a second internal electrode having a third lead portion spaced apart from the first and second lead portions and exposed to the first surface of the ceramic green sheet was formed by applying a conductive paste for a nickel internal electrode to the ceramic green sheets using a screen.

Then, ceramic green sheets were variously stacked so that the number of stacked ceramic green sheets was about 150 to 400, but ceramic green sheets on which the first and second internal electrodes were not formed were further stacked on both side surfaces, thereby manufacturing multilayer bodies. Thereafter, these multilayer bodies were subjected to isostatic pressing at 85° C. and a pressure of 1000 kgf/cm².

Then, the ceramic multilayer bodies subjected to the isostatic pressing were cut into individual chip form, and debinding was performed on the cut ceramic multilayer bodies by maintaining the cut ceramic multilayer bodies at a temperature about 230° C. for 60 hours under an air atmosphere.

Thereafter, the ceramic multilayer bodies were sintered at about 1200° C. under a reduction atmosphere having oxygen partial pressure of $10^{-11}$ atm to $10^{-10}$ atm lower than Ni/NiO equilibrium oxygen partial pressure, so that the internal electrodes were not oxidized, thereby preparing ceramic bodies.

Next, first to third external electrodes were formed on first surfaces of respective ceramic bodies to correspond to first and second lead portions of the first internal electrode and a third lead portion of the second internal electrode, respectively.

Then, first and second insulating portions were formed on the first surfaces of respective ceramic bodies, thereby completing the formation of multilayer ceramic capacitors.

In this case, a ratio between the width of overlap portions of the first and second insulating portions, covering portions of the first to third external electrodes, and the width of the first to third external electrodes, was variously adjusted.

Thereafter, reliability and contact property tests were performed, yielding the results illustrated in Table 1. Each of the tests was performed on 100 test samples.

In order to evaluate reliability, both accelerated lifespan and moisture resistance were evaluated, with accelerated lifespan being evaluated primarily at 60° C. and 1 Vr for 1 hour, secondarily evaluated at 85° C. and 1 Vr for 1 hour, and tertiarily evaluated at 85° C. and 1.5 Vr for 1 hour.

Moisture resistance was primarily evaluated at 60° C., 85%, and 1 Vr for 1 hour, and secondarily evaluated at 85° C., 85%, and 1 Vr for 1 hour.

At the time of evaluating the contact properties, a non-contact generation rate of a selector at the time of evaluating reliability was considered and recorded as the contact properties.

TABLE 1

| No. | Ratio (%) of Width of Epoxy Margin to Width of External Electrode (i/e * 100) | Reliability Test Pass Rate (%) | Measured Contact Properties (%, N.C) |
|---|---|---|---|
| 1 | 0.01 | 20 | 98 |
| 2 | 0.05 | 25 | 97 |
| 3 | 0.1 | 20 | 98 |
| 4 | 0.2 | 30 | 98 |
| 5 | 0.3 | 22 | 95 |
| 6 | 0.4 | 25 | 94 |
| 7 | 0.5 | 70 | 97 |
| 8 | 5 | 70 | 98 |
| 9 | 15 | 80 | 95 |
| 10 | 25 | 90 | 96 |
| 11 | 50 | 91 | 92 |
| 12 | 60 | 93 | 82 |
| 13 | 70 | 94 | 70 |
| 14 | 75 | 95 | 65 |
| 15 | 80 | 95 | 43 |
| 16 | 90 | 100 | 20 |

Referring to Table 1, when a width of one of the first and second overlap portions was defined as i, and a width of one of the first to third external electrodes, corresponding to i, was defined as e, in a case in which i/e satisfied 0.005≤i/e≤0.7, as in samples 7 to 13, the reliability test pass rate was 70% or more, and the measured contact properties was 70% or more.

Further, in samples 1 to 6, in which i/e was less than 0.005, the reliability test pass rate was significantly decreased, to 25% or less.

In addition, in samples 14 to 16, in which i/e was more than 0.7, the measured contact properties were significantly decreased, to less than 70%.

Therefore, it may be appreciated that in order to secure both reliability and the contact properties at predetermined levels or more, i/e needs to satisfy 0.005≤i/e≤0.7.

MODIFIED EMBODIMENTS

Figure 5:
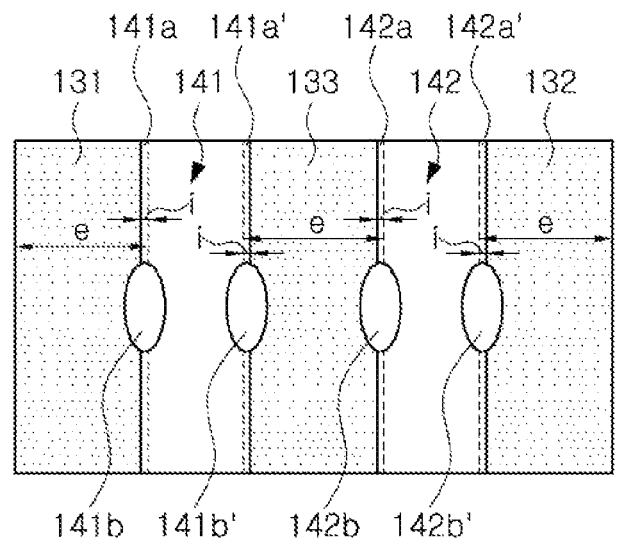
FIG. 5 is a bottom view illustrating another example of an insulating part of the multilayer ceramic capacitor, according to the exemplary embodiment in the present disclosure.
Figure 6:
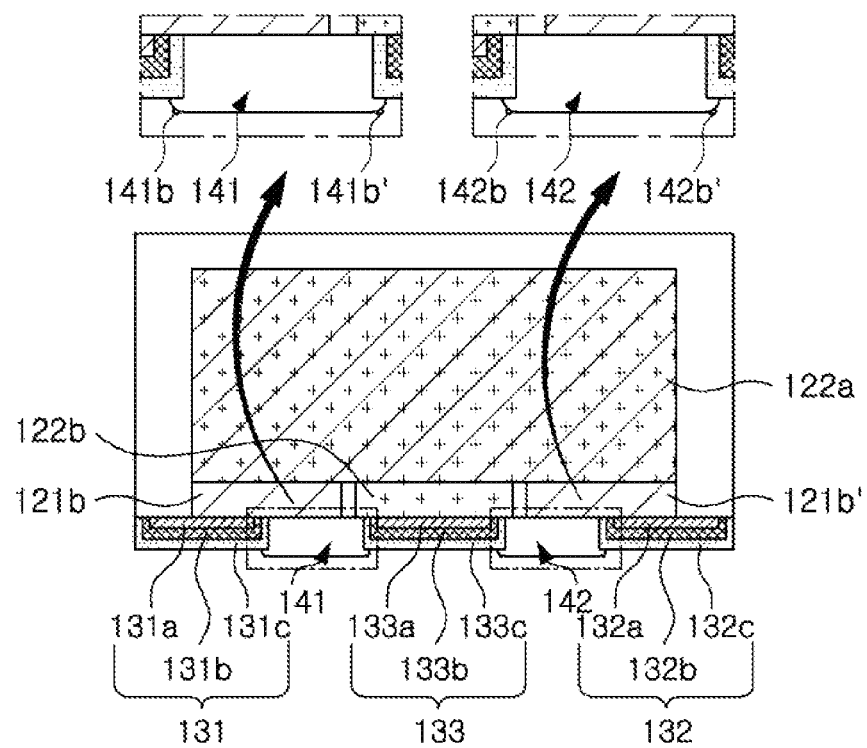
FIG. 6 is a cross-sectional view, cut along a length-thickness plane, illustrating another example of the insulating part of the multilayer ceramic capacitor according to the exemplary embodiment in the present disclosure.

FIG. 5 is a bottom view illustrating another example of an insulating part of the multilayer ceramic capacitor according to the exemplary embodiment in the present disclosure, and FIG. 6 is a cross-sectional view, cut along a length-thickness plane, illustrating another example of the insulating part of the multilayer ceramic capacitor according to the exemplary embodiment in the present disclosure.

Here, in order to avoid overlapping descriptions, contents the same as those described above will be omitted, and first and second insulating portions 1410 and 1420 having different structures from those in the exemplary embodiment described above will be described in detail.

Referring to FIGS. 5 and 6, in the first and second insulating portions 1410 and 1420, according to the present exemplary embodiment, protrusion portions 141b and 142b may be formed in portions of the first or second overlap portions 141a and 141a' or 142a and 142a'.

If necessary, the protrusion portions 141b and 142b may be formed in central portions of the first and second insulating portions 1410 and 1420 in a length direction thereof.

Figure 7:
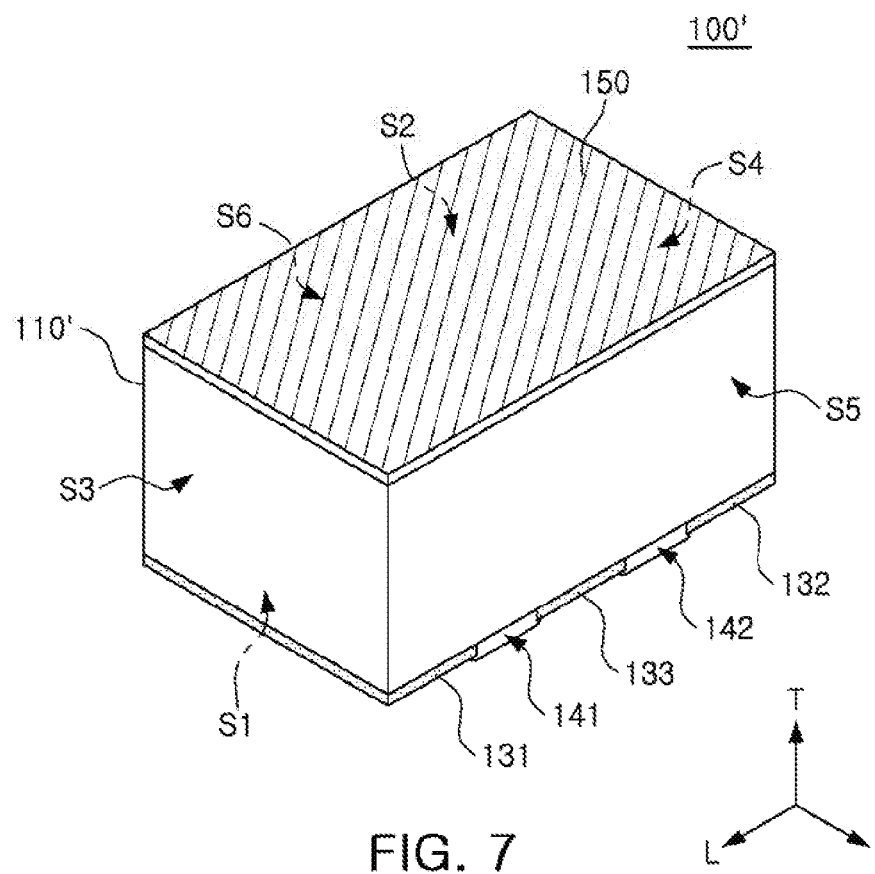
FIG. 7 is a perspective view schematically illustrating a multilayer ceramic capacitor according to another exemplary embodiment in the present disclosure.
Figure 8:
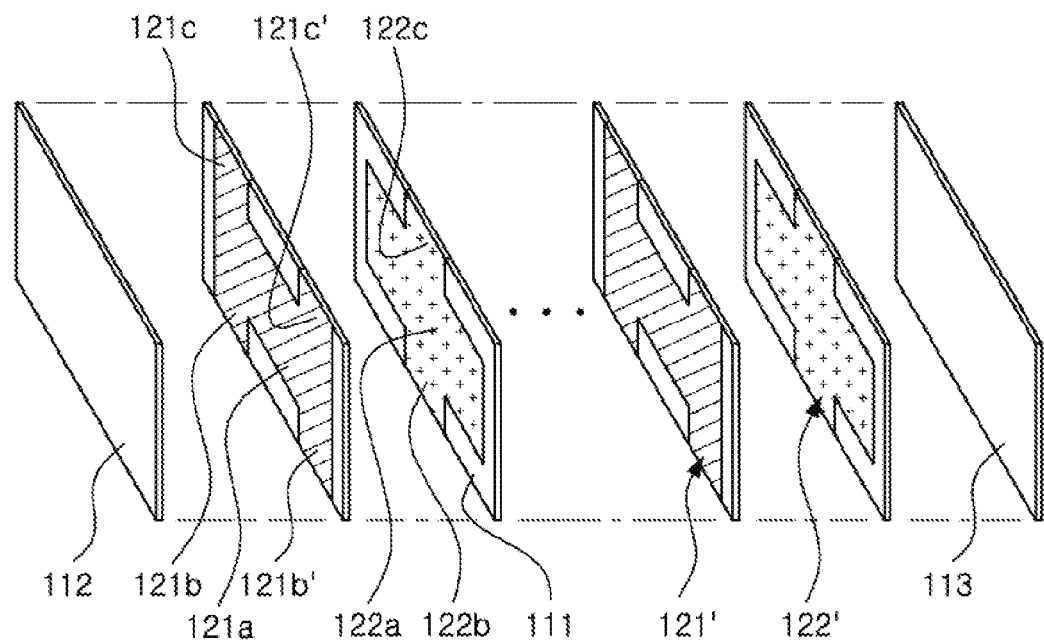
FIG. 8 is an exploded perspective view schematically illustrating a stacking structure of internal electrodes of the multilayer ceramic capacitor of FIG. 7.
Figure 9:
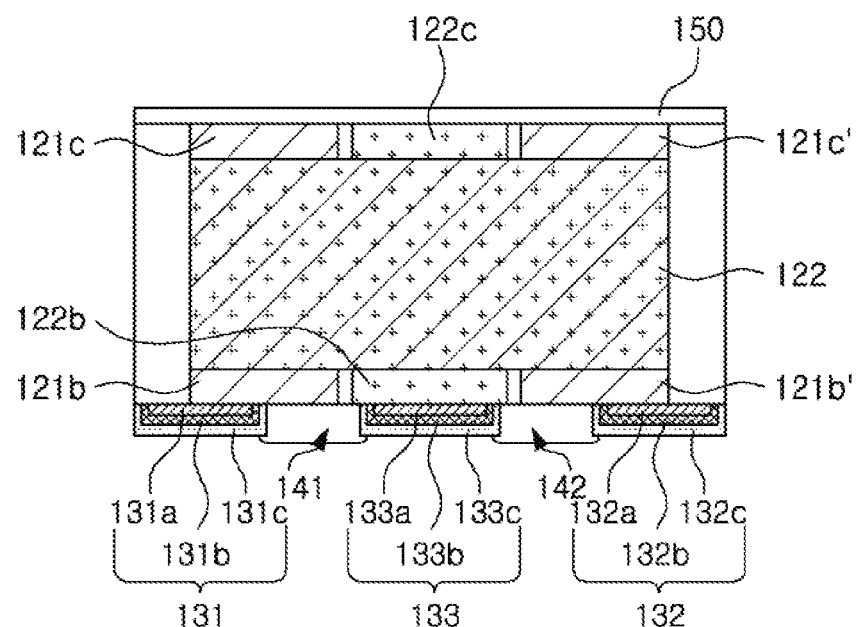
FIG. 9 is a cross-sectional view of the multilayer ceramic capacitor of FIG. 7, cut along a length-thickness plane.

FIG. 7 is a perspective view schematically illustrating a multilayer ceramic capacitor according to another exemplary embodiment in the present disclosure, FIG. 8 is an exploded perspective view schematically illustrating a stacking structure of internal electrodes of the multilayer ceramic capacitor of FIG. 7, and FIG. 9 of the multilayer ceramic capacitor is a cross-sectional view of FIG. 7, cut along a length-thickness plane.

Here, in order to avoid overlapping descriptions, contents the same as those described above will be omitted in order to avoid an overlapping description, a detailed description of the same structure as that in the exemplary embodiment described above will be omitted, and first and second internal electrodes 121' and 122' and an insulating layer 150, having different structures from those in the exemplary embodiment described above, will be described in detail.

Referring to FIGS. 7 through 9, in a multilayer ceramic capacitor 100' according to the present exemplary embodiment, the insulating layer 150 may be disposed on a second surface S2 opposing a first surface S1 thereof, a mounting surface of a ceramic body 110'.

In this case, a first internal electrode 121' may have fourth and fifth lead portions 121c and 121c' exposed to the second surface S2 of the ceramic body 110' to contact the insulating layer 150 formed on the second surface S2 of the ceramic body 110'.

A second internal electrode 122' may have a sixth lead portion 122c disposed between the fourth and fifth lead portions 121c and 121c' and exposed to the second surface S2 of the ceramic body 110' to contact the insulating layer 150.

In this case, the insulating layer 150 may serve to cover the fourth to sixth lead portions 121c, 121c' and 122c exposed from first and second body portions 121a and 122a of the first and second internal electrodes 121 and 122 to the second surface S2 of the ceramic body 110' to prevent problems such as a short-circuit between the lead portions and deterioration of moisture resistance or short-circuit by external foreign materials.

In addition, the insulating layer 150 may be formed of an insulating material, for example, an epoxy, a ceramic slurry, or the like, but the material of the insulating layer 150 is not limited thereto.

Figure 10:
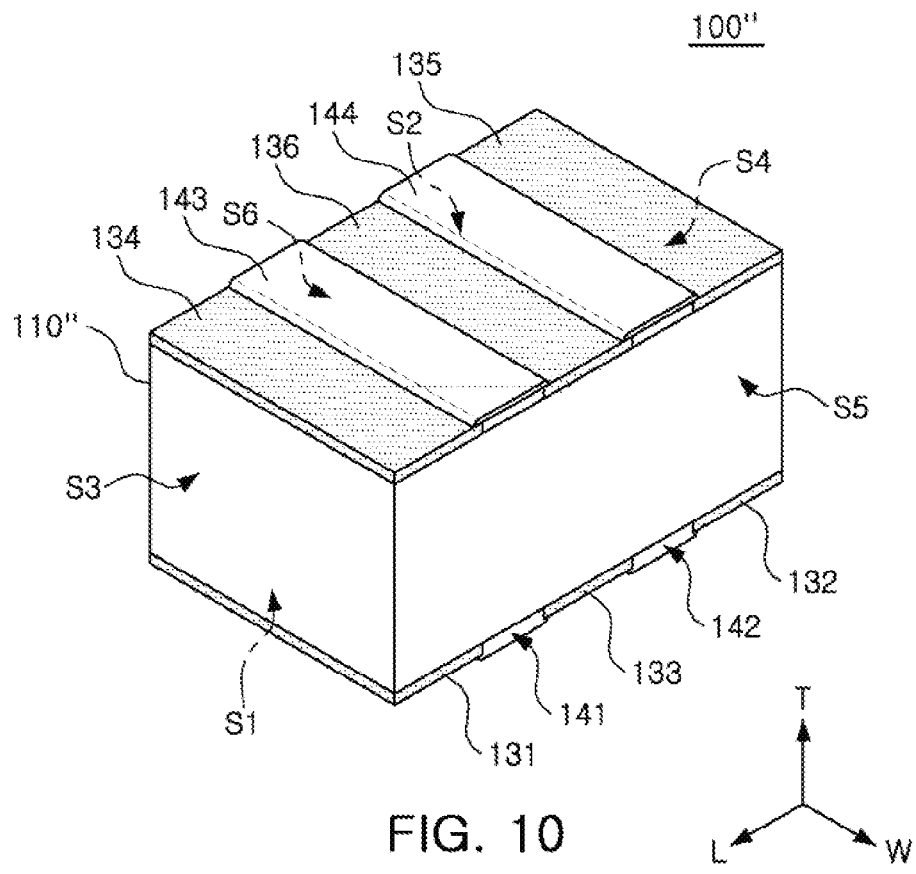
FIG. 10 is a perspective view schematically illustrating a multilayer ceramic capacitor according to another exemplary embodiment in the present disclosure.
Figure 11:
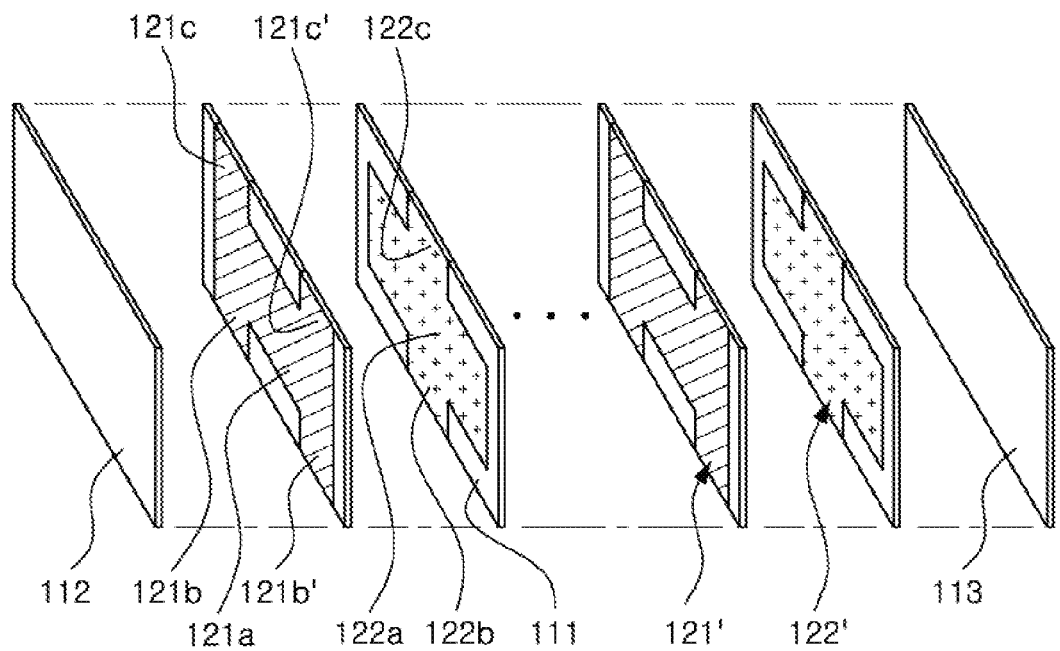
FIG. 11 is an exploded perspective view schematically illustrating a stacking structure of internal electrodes of the multilayer ceramic capacitor of FIG. 10.
Figure 12:
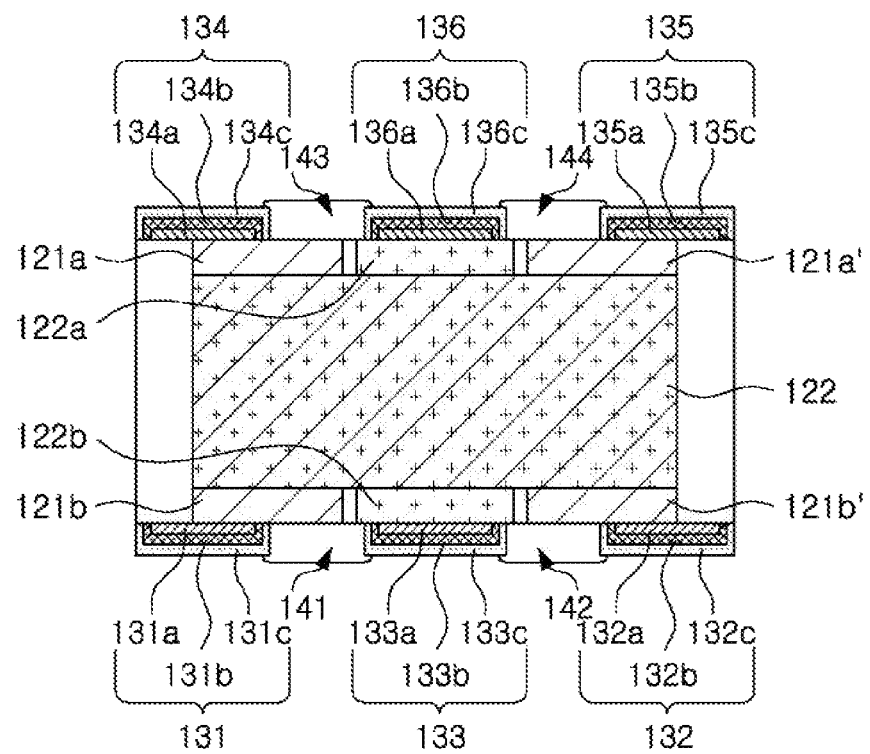
FIG. 12 is a cross-sectional view of the multilayer ceramic capacitor of FIG. 10, cut along a length-thickness plane.

FIG. 10 is a perspective view schematically illustrating a multilayer ceramic capacitor according to another exemplary embodiment in the present disclosure, FIG. 11 is an exploded perspective view schematically illustrating a stacking structure of internal electrodes of the multilayer ceramic capacitor of FIG. 10, and FIG. 12 is a cross-sectional view of the multilayer ceramic capacitor of FIG. 10, cut along a length-thickness plane.

Here, in order to avoid an overlapping description, a contents the same as those described above will be omitted, and first and second internal electrodes 121' and 122' and fourth to sixth external electrodes 134 to 136 having different structures from those in the exemplary embodiment described above will be described in detail.

Referring to FIGS. 10 through 12, in a multilayer ceramic capacitor 100'' according to the present exemplary embodiment, the fourth to sixth external electrodes 134 to 136 may be disposed on a second surface S2 of a ceramic body 110'' to face first to third external electrodes 131 to 133, respectively.

In this case, if necessary, the fourth to sixth external electrodes 134 to 136 may extend to portions of fifth and sixth surfaces S5 and S6 of the ceramic body 110'' in a width direction.

Further, the fourth to sixth external electrodes 134 to 136, which have a three-layer structure, may include fourth to sixth conductive layers 134a to 136a contacting the corresponding lead portions of the internal electrodes, respectively, to thereby be connected thereto; fourth to sixth nickel (Ni) plating layers 134b to 136b, formed to cover the fourth to sixth conductive layers 134ab to 136a; and fourth to sixth tin (Sn) plating layers 134c to 136c, formed to cover the fourth to sixth nickel plating layers 134b to 136b.

In addition, the first internal electrode 121' may have fourth and fifth lead portions 121c and 121c' exposed to the second surface S2 of the ceramic body 110'' to contact the fourth and fifth external electrodes 134 and 135, formed on the second surface S2 of the ceramic body 110'' to thereby be electrically connected thereto, respectively.

The second internal electrode 122' may have a sixth lead portion 122c disposed between the fourth and fifth lead portions 121c and 121c' and exposed to the second surface S2 of the ceramic body 110'' to contact the sixth external electrode 136 to thereby be electrically connected thereto.

In a case in which structures of the internal and external electrodes of the multilayer ceramic capacitor 100'' are formed to be vertically symmetrical to each other, directionality of the capacitor may be removed.

Therefore, since any one of the first and second surfaces S1 and S2 of the multilayer ceramic capacitor 100'' may be provided as a mounting surface, there is an advantage in that at the time of mounting the multilayer ceramic capacitor 100'' on a circuit board, there is no need to consider the direction of the mounting surface.

Board Having Multilayer Ceramic Capacitor

Figure 13:
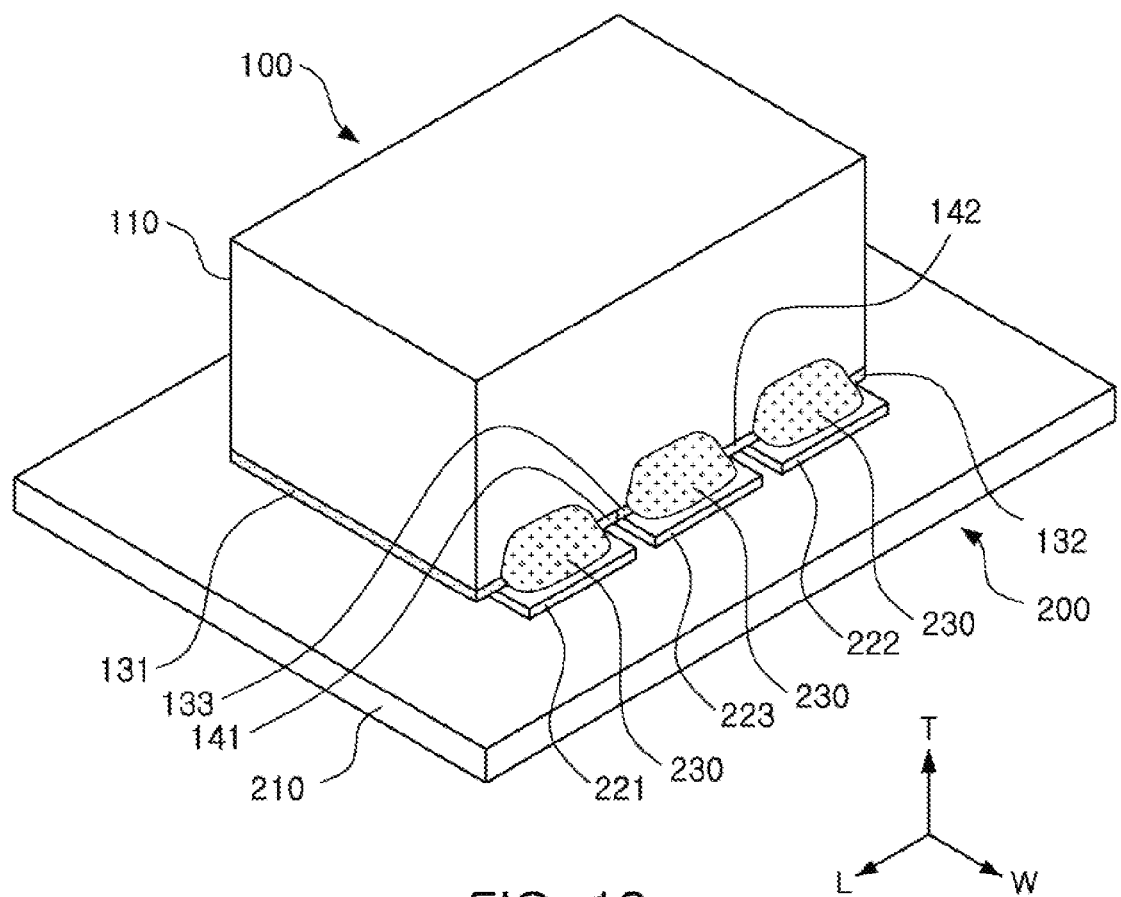
FIG. 13 is a perspective view illustrating a board in which the multilayer ceramic capacitor of FIG. 1 is mounted on a circuit board.
Figure 14:
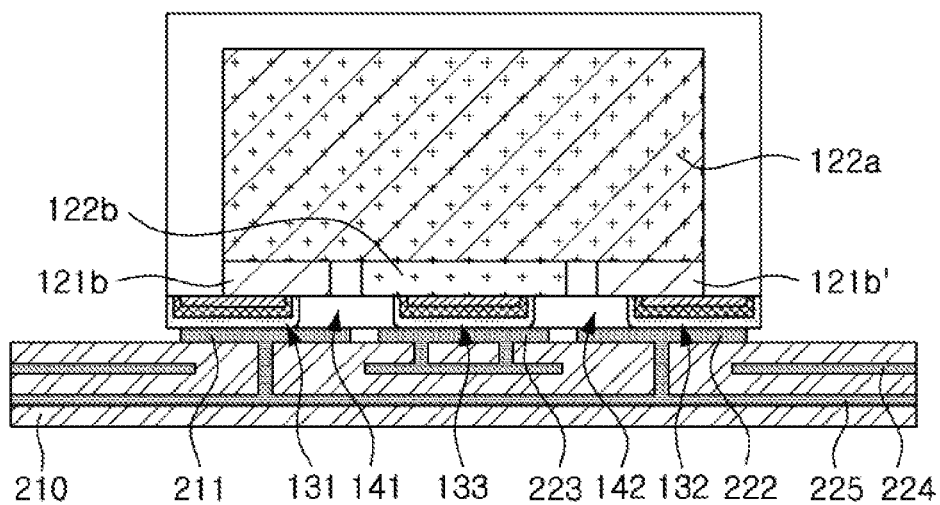
FIG. 14 is a cross-sectional view of the board with the multilayer ceramic capacitor of FIG. 13, cut along a length-thickness plane.

FIG. 13 is a perspective view illustrating a board in which the multilayer ceramic capacitor of FIG. 1 is mounted on a circuit board, and FIG. 14 is a cross-sectional view of the board with the multilayer ceramic capacitor of FIG. 13, cut along a length-thickness plane.

Referring to FIGS. 13 and 14, a board 200 having a multilayer ceramic capacitor, built according to the present exemplary embodiment, may include a circuit board 210 on which the first to third external electrodes 131 to 133 of the multilayer ceramic capacitor 100 are horizontally mounted and first to third electrode pads 221 to 223, formed on the circuit board 210, are spaced apart from each other.

In this case, the multilayer ceramic capacitor 100 may be electrically connected to the circuit board 210 by solder 230 in a state in which the first to third external electrodes 131 to 133 are positioned to contact the first to third electrode pads 221 to 223, respectively.

In FIG. 12, reference numeral 224 indicates a ground terminal, and reference numeral 225 indicates a power terminal.

Meanwhile, although the board on which the multilayer ceramic capacitor of FIG. 1 is mounted is illustrated and described in the present exemplary embodiment, the board is not limited thereto. For example, the multilayer ceramic capacitor of FIG. 7 or 10 may also be mounted in a structure similar to that on the circuit board, thereby configuring the board having a multilayer ceramic capacitor.

As set forth above, according to exemplary embodiments in the present disclosure, the ESL may be decreased by the 3-terminal, vertical, multilayer structure, and capacitance of the multilayer ceramic capacitor may be increased by increasing the area of the overlap regions of the first and second internal electrodes.

In addition, the internal electrodes exposed to the outside of the ceramic body may be protected and the contact properties may be secured at a predetermined level or higher by adjusting the width of the overlap regions of the first and second insulating portions and the first to third external electrodes.

While exemplary embodiments have been shown and described above, it will be apparent to those skilled in the art that modifications and variations could be made without departing from the scope of the present invention, as defined by the appended claims.

What is claimed is:

1. A multilayer ceramic capacitor comprising:
   a ceramic body, including an active layer in which a plurality of dielectric layers are stacked and a plurality of first and second internal electrodes are disposed with respective dielectric layers interposed therebetween;
   first and second lead portions extending from the first internal electrode to be exposed to a mounting surface of the ceramic body, and disposed to be spaced apart from each other in a length direction of the ceramic body;
   a third lead portion extending from the second internal electrode to be exposed to the mounting surface of the ceramic body, and disposed between the first and second lead portions;
   first and second external electrodes disposed on the mounting surface of the ceramic body to be spaced apart from each other in the length direction of the ceramic body, and connected to the first and second lead portions, respectively, wherein portions of the first and second lead portions not covered by the first and second external electrodes are exposed to the mounting surface of the ceramic body;
   a third external electrode disposed between the first and second external electrodes on the mounting surface of the ceramic body, and connected to the third lead portion, wherein portions of the third lead portion not covered by the third external electrode are exposed to the mounting surface of the ceramic body;
   a first insulating part including opposite end portions, which are a pair of first overlap portions covering portions of the first and third external electrodes, respectively, the first insulating part disposed between the first and third external electrodes on the mounting surface of the ceramic body; and
   a second insulating part including opposite end portions, which are a pair of second overlap portions covering portions of the second and third external electrodes, respectively, the second insulating part disposed between the second and third external electrodes on the mounting surface of the ceramic body, wherein $0.005 \leq i/e \leq 0.7$, in which i is a width of one of the first and second overlap portions, and e is a width of one of the first to third external electrodes partially covered by the one of the first and second overlap portions.

2. The multilayer ceramic capacitor of claim 1, wherein the first or second overlap portion includes a protrusion portion.

3. The multilayer ceramic capacitor of claim 1, wherein the dielectric layers and the internal electrodes are stacked in a width direction of the ceramic body.

4. The multilayer ceramic capacitor of claim 1, wherein the first and second insulating portions are formed of either epoxy or ceramic slurry.

5. The multilayer ceramic capacitor of claim 1, wherein the first and second internal electrodes are disposed to be spaced apart from both surfaces of the ceramic body in the length direction thereof.

6. The multilayer ceramic capacitor of claim 1, further comprising cover layers disposed on both sides of the active layer, respectively.

7. The multilayer ceramic capacitor of claim 1, further comprising:
   fourth and fifth lead portions, extending from the first internal electrode to be exposed to a surface of the ceramic body opposing the mounting surface thereof, and disposed to be spaced apart from each other in the length direction of the ceramic body;
   a sixth lead portion, extending from the second internal electrode to be exposed to the surface of the ceramic body opposing the mounting surface thereof, and disposed between the fourth and fifth lead portions; and
   an insulating layer disposed on the surface of the ceramic body opposing the mounting surface thereof.

8. The multilayer ceramic capacitor of claim 1, further comprising:
   fourth and fifth lead portions, extending from the first internal electrode to be exposed to a surface of the ceramic body opposing the mounting surface thereof, and disposed to be spaced apart from each other in the length direction of the ceramic body;
   a sixth lead portion extending from the second internal electrode to be exposed to the surface of the ceramic body opposing the mounting surface thereof, and disposed between the fourth and fifth lead portions;
   fourth and fifth external electrodes disposed on the surface of the ceramic body opposing the mounting surface, spaced apart from each other in the length direction of the ceramic body, and connected to the fourth and fifth lead portions, respectively, wherein portions of the fourth and fifth lead portions not covered by the fourth and fifth external electrodes are exposed to the surface of the ceramic body opposing the mounting surface thereof; and
   a sixth external electrode disposed between the fourth and fifth external electrodes on the surface of the ceramic body opposing the mounting surface thereof, and connected to the sixth lead portion, wherein portions of the sixth lead portion not covered by the sixth external electrode are exposed to the surface of the ceramic body opposing the mounting surface thereof;
   a third insulating part including opposite end portions, which are a pair of third overlap portions covering portions of the fourth and sixth external electrodes, respectively, the third insulating part disposed between the fourth and sixth external electrodes on the surface of the ceramic body opposing the mounting surface thereof; and
   a fourth insulating part including opposite end portions, which are a pair of fourth overlap portions covering portions of the fifth and sixth external electrodes, respectively, the fourth insulating part disposed between the fifth and sixth external electrodes on the surface of the ceramic body opposing the mounting surface thereof.

9. The multilayer ceramic capacitor of claim 8, wherein $0.005 \leq i/e \leq 0.7$, in which i is a width of one of the third and fourth overlap portions, and e is a width of one of the fourth to sixth external electrodes partially covered by the one of the third and fourth overlap portions.

10. The multilayer ceramic capacitor of claim 8, wherein the third or fourth overlap portion includes a protrusion portion.

11. A board having a multilayer ceramic capacitor, the board comprising:
- a circuit board on which first to third electrode pads are provided; and
- the multilayer ceramic capacitor of claim 1, mounted on the circuit board so that the first to third external electrodes are disposed on the first to third electrode pads, respectively.

\* \* \* \* \*